United States Patent
Eskridge et al.

(10) Patent No.: US 7,402,905 B2
(45) Date of Patent: Jul. 22, 2008

(54) METHODS OF FABRICATION OF WAFER-LEVEL VACUUM PACKAGED DEVICES

(75) Inventors: Mark H. Eskridge, Renton, WA (US); Ijaz H. Jafri, Woodinville, WA (US)

(73) Assignee: Honeywell International Inc., Morristown, NJ (US)

( * ) Notice: Subject to any disclaimer, the term of this patent is extended or adjusted under 35 U.S.C. 154(b) by 39 days.

(21) Appl. No.: 11/462,767

(22) Filed: Aug. 7, 2006

(65) Prior Publication Data

US 2008/0029863 A1    Feb. 7, 2008

(51) Int. Cl.
*H01L 23/14* (2006.01)
(52) U.S. Cl. .................. 257/702; 257/678; 257/701; 257/682; 438/125
(58) Field of Classification Search .......... 257/680, 257/682, 685, 686, 687, 690, 693, 701, 702, 257/E23.003, E23.009, E23.011, E23.116, 257/117, 118, E23.18; 438/125–127
See application file for complete search history.

(56) References Cited

U.S. PATENT DOCUMENTS

| | | | | |
|---|---|---|---|---|
| 2005/0006738 A1* | 1/2005 | Schaper et al. | ............ | 257/678 |
| 2005/0085053 A1* | 4/2005 | Chen et al. | ............ | 438/471 |
| 2005/0233543 A1* | 10/2005 | Wei et al. | ............ | 438/455 |
| 2006/0110893 A1* | 5/2006 | Quenzer et al. | ............ | 438/455 |
| 2007/0023890 A1* | 2/2007 | Haluzak et al. | ............ | 257/704 |

* cited by examiner

*Primary Examiner*—M. Wilczewski
*Assistant Examiner*—Paul E Patton
(74) *Attorney, Agent, or Firm*—Black Lowe & Graham PLLC

(57) ABSTRACT

An hermetic, gas filled or vacuum package device and method of making a vacuum package device. The device includes a device layer having one or more Micro Electro-Mechanical Systems (MEMS) devices. The device layer includes one or more electrical leads coupled to the one or more MEMS devices. The device also includes a first wafer having one or more silicon pins, wherein a first surface of the first wafer is bonded to a first surface of the device layer in such a manner that the one or more silicon pins are in electrical communication with the electrical leads. A second wafer, which may also have one or more silicon pins, is bonded to a second surface of the device layer. The first and second wafers are formed of borosilicate glass and the device layer is formed of silicon.

11 Claims, 3 Drawing Sheets

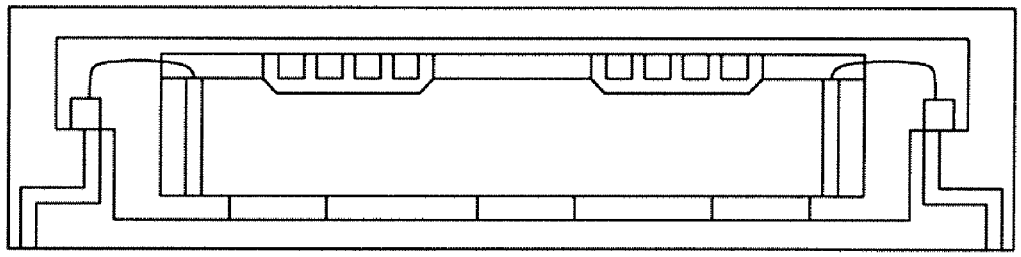
FIG. 1 *(PRIOR ART)*
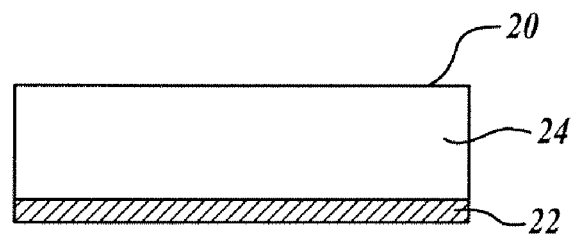
FIG. 2A
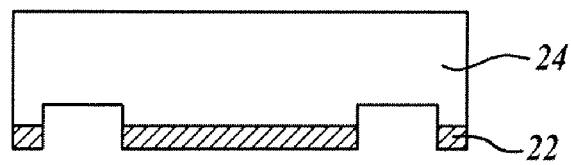
FIG. 2B

METHODS OF FABRICATION OF WAFER-LEVEL VACUUM PACKAGED DEVICES

BACKGROUND OF THE INVENTION

Currently, Micro Electro-Mechanical Systems (MEMS) devices are packaged using chip scale packaging techniques, such as that shown in FIG. 1. The MEMS device is first created on a substrate. The MEMS device and substrate are then placed within a housing with electrical leads that extend to and through the housing for electrically connecting the MEMS device with other systems external to the housing. This method incurs the extra cost of the housing materials as well as the time and cost of mounting the substrate and MEMS device within the housing in such a manner so as not to exhibit any thermal stress due to differences in coefficients of thermal expansion between the substrate and the housing. Also, the resulting device formed by current methods is a larger package that takes up a large amount real estate in the final integrated circuit product.

Therefore, there exists a need in the art for lower cost methods for manufacturing wafer-level vacuum packaged devices.

SUMMARY OF THE INVENTION

The present invention provides a vacuum package device and method of making a vacuum package device. The device includes a device layer having one or more Micro Electro-Mechanical Systems (MEMS) devices. The device layer includes one or more electrical leads coupled to the one or more MEMS devices. The device also includes a first wafer having one or more silicon pins, wherein a first surface of the first wafer is bonded to a first surface of the device layer in such a manner that the one or more silicon pins are in electrical communication with the electrical leads. A second wafer is bonded to a second surface of the device layer.

The first and second wafers include one or more troughs that are co-located with the MEMS device to form one or more cavities. A getter material is deposited within at least one of the cavities and activated in order to create a vacuum within the respective cavity.

The first wafer is formed of borosilicate glass (such as Pyrex® glass produced by Corning) and the second wafer is formed of silicon.

BRIEF DESCRIPTION OF THE DRAWINGS

The preferred and alternative embodiments of the present invention are described in detail below with reference to the following drawings:

FIG. 1 illustrates a side cut-away view of a hermetically packaged device formed in accordance with the prior art; and FIGS. 2A-K illustrate fabrication stages of a wafer-level vacuum package device formed in accordance with an embodiment of the present invention.

DETAILED DESCRIPTION OF THE PREFERRED EMBODIMENT

FIGS. 2A-2K illustrate stages in a fabrication process for creating a wafer-level vacuum packaged device. First at FIGS. 2A and B, a device layer wafer 20 is created by Deep Reactive Ion Etching of an epitaxial layer on a silicon substrate. Alternately, this device layer wafer 20 could be created by other surface and bulk silicon micromachining methods. The device layer wafer 20 includes a mechanism or device layer 22 on top of a substrate 24. The mechanism formed in this step is intentionally surrounded by a frame in the same layer to serve as a "seal ring" in a later step.

Figure 2C:
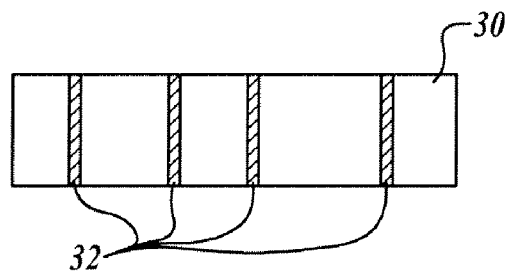
Figure 2D:
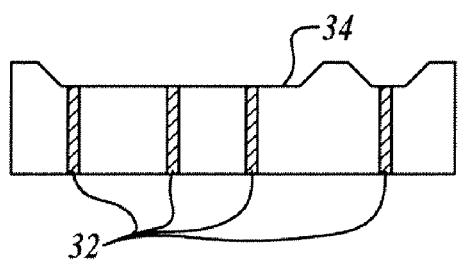
Figure 2E:
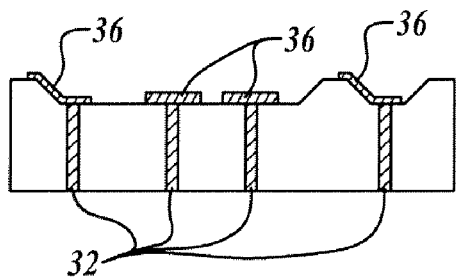
Figure 2F:
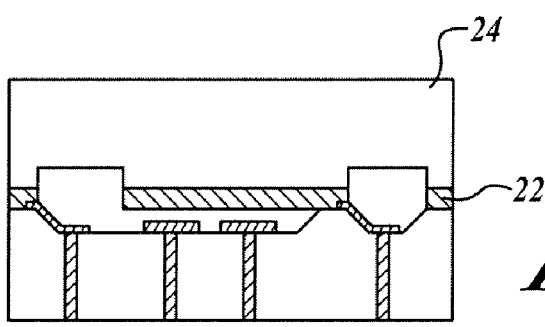

As shown in FIG. 2C, a first glass wafer 30 has one or more embedded Si pins 32. The wafer 30 is preferably a borosilicate glass wafer (such as Pyrex® glass produced by Corning). The pins 32 are spaced apart on the wafer 30 at pre-defined distances in order to be proximate to a MEMS device electrical connection. The pins 32 are embedded in the wafer 30 and are hermetically sealed with the wafer 30. The pins 32 completely penetrate the wafer 30, and are finished to be flush with or very slightly proud of the surface of the wafer 30. As shown in FIG. 2D, troughs 34 are etched into a top surface of the wafer 30 in order to form a cavity for housing (and providing a capacitive gap for) the MEMS device. As shown in FIG. 2E, Electrical connection between the mechanism (MEMS device) and the pins 32 which run through the wafer 30 is made during this step, when metal traces and "pads" 36 (areas designated for later electrical connections) are deposited on the tops of the pins 32. The electrically conductive components, traces to the components, and pads 36 are designed to align the respective Si pins 32. Next, the device wafer 20 shown in FIG. 2B is inverted and then attached to the top surface of the wafer 30 using any of the number of various bonding methods, such as an anodic wafer bonding for bonding Si and Pyrex®. Other methods that could be used include frit, eutectic, or adhesive bonding. Next, the sacrificial substrate 24 of the wafer 20 is removed by etching, thereby leaving just the device layer 22 attached to the top surface of the wafer 30. Prior to bonding, the device/mechanism of FIG. 2B is positioned over the wafer 30 such that the MEMS device created in the device layer is co-located with a trough 34 where the MEMS device needs to be free to move. The device layer 22 is attached to the first wafer 30 at connection points or mesas. Bonding brings the metal patterns on the first wafer 30 into intimate contact with the Silicon of the device layer 22, forming an electrical connection. These pads may be directly on top of the pins 32, or be connected by a metal trace on the first wafer 30 to a point where the metal is deposited on a pin.

Removal of the substrate 24 is performed by any of a number of known substrate removal methods, such as buffing, etching, grinding, polishing, plasma etching (RIE, DRIE), ion milling, chemical etching (where the substrate is dissolved by the solution but the device layer is not, due to proper doping) such as KOH, EDP, TMAH etc., or other known methods.

Figure 2G:
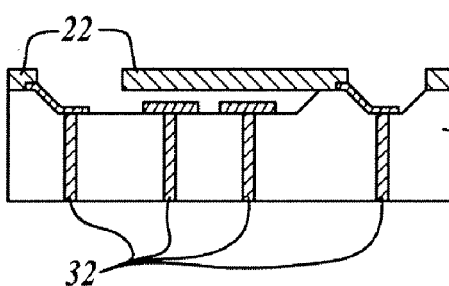
Figure 2H:
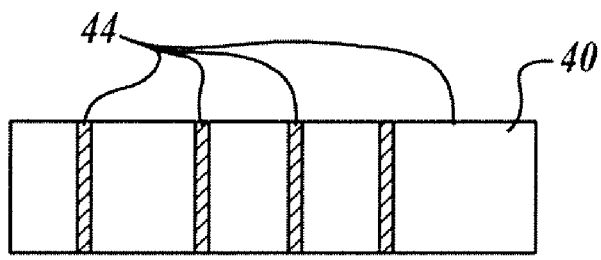
Figure 2I:
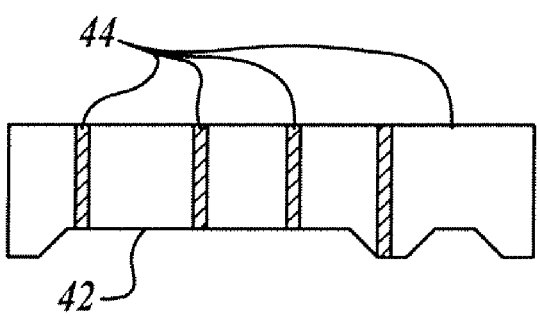
Figure 2J:
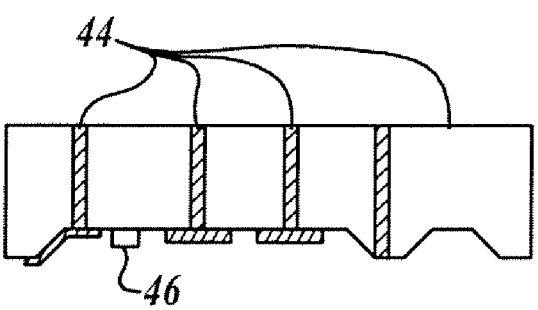

As shown in FIGS. 2H-J, a cap wafer 40 which is formed of Pyrex® or Si is etched with troughs 42 that will form an upper portion of cavities for housing the MEMS devices. In this embodiment the cap wafer 40 includes Si pins 44. A getter material 46 may be deposited into each of the troughs 42. In an alternate embodiment, the getter material may be bonded to the troughs 34 of the base substrate 30. Electrically conductive components may be applied on the base, sides, and around the tops of the troughs 42 (similar to FIGS. 2C-E).

Figure 2K:
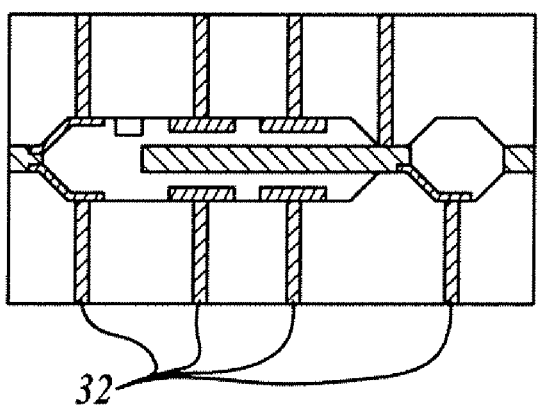

As shown in FIG. 2K, the cap wafer 40 of FIG. 2J is inverted and attached to the device of FIG. 2G such that the troughs 42 are co-located with the MEMS devices in the device layer 22 and the troughs 34 formed in the wafer 30. Bonding can be performed by any of the number of methods, such as anodic bonding, direct Si to Si, heat and pressure bonding (also called fusion bonding), eutectic bonding, frit bonding or some other method. At the time of the bonding of the cap wafer 40 to the base structure of FIG. 2G (or after the bonding occurs), the getter material 46 is activated by heating the device to a pre-defined temperature, such as 300° C. Activation of the getter material 46 results in a gettering in the cavity formed by the troughs 42 and 34. This bonding is very similar to the bond made from the device layer 22 to the first wafer 30.

In another embodiment, a Si pin 32 in the first wafer 30 may be bonded to a Si pin 44 in the wafter 40 via the device layer 22.

The resulting device shown in FIG. 2K now includes MEMS devices formed in vacuum cavities that are electrically connected to an external top and or bottom surface of the device via the Si pins 32 and 44. Therefore, the device can now be connected to a printed wiring board (PWB), using the Si pins 32 and 44. It is possible to connect the Si pins 32 directly to a printed circuit board, or to bring the signals out of the die in one pattern and then connect to the board using flip chip technique (if the pins are on the bottom) or wirebond technique (for pins on the top) using a different pattern. Therefore, traces are formed from the Si pins 32 and 44 to pads on other areas on the surface of the die.

In an alternate embodiment, the cap wafer 40 is a borosilicate glass wafer that does not include any Si pins, therefore all signals are sent through the pins of the first glass wafer 30. The cap wafer 40 may be a silicon wafer that is anodically or frit bonded to the first glass wafer 30 (ensuring hermiticity).

The processes shown above in FIGS. 2A-K are preferably performed across an entire wafer. In other words, a plurality of MEMS cavities are formed and once the cap wafer is bonded to the base wafer, then the entire wafer is diced in order to separate the cavities into definite units (individual die) for eventual attachment to a circuit board or other die such as an Application Specific Integrate Circuit (ASIC) die.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The invention claimed is:

1. A hermetically sealed device comprising:
a device layer comprising one or more Micro Electro-Mechanical Systems (MEMS) devices, the device layer having a first surface and a second surface, the MEMs devices having a first electrical lead and a second electrical lead;
a first wafer includes borosilicate glass, the first wafer having a first surface and a second surface and a silicon in extending from the first surface to the second surface, wherein the first surface of the first wafer is bonded to the first surface of the device layer such that the silicon pin of the first wafer is in electrical communication with the first electrical lead of at least one MEMS device; and
a second wafer having a first surface and a second surface and a silicon pin extending from the first surface to the second surface, wherein the first surface of the second wafer is bonded to the second surface of the device layer such that the silicon pin of the second wafer is in electrical communication with the second electrical lead of at least one MEMS device.

2. The device of claim 1, wherein the first and second wafers include one or more troughs forming one or more cavities to contain one or more MEMS devices.

3. The device of claim 2, further comprising a getter material deposited within one or more of the cavities.

4. The device of claim 3, wherein the getter material is deposited in one or both of the first and second wafers' troughs prior to bonding the wafers to the device layer and the getter material being activated using a heating process.

5. A method of making a vacuum package device, the method comprising:
forming one or more Micro Electro-Mechanical Systems (MEMS) devices in a device layer;
forming a first wafer having a silicon pin therethrough and one or more electrical leads coupled to the silicon pin;
bonding the first wafer to a first surface of the device layer in such a manner that the silicon pin of the first wafer is in electrical communication with portions of the device layer; and
bonding a second wafer formed in a manner similar to the first wafer to a second surface of the device layer to form a seal, such that a silicon pin of the second wafer is in electrical communication with at least one portion of the device layer.

6. The method of claim 5, further comprising forming one or more troughs in the first and second wafers.

7. The method of claim 6, further comprising positioning the troughs over the one or more MEMS devices to form a cavity.

8. The method of claim 6, further comprising depositing a getter material within at least one of the troughs as required.

9. The method of claim 8, further comprising heating the getter material to an activation point.

10. The method of claim 5, wherein the first and second wafer includes Pyrex glass and the device wafer includes silicon.

11. The method of claim 5, wherein the second wafer includes first and second surfaces, the silicon pins extending from the first surface to the second surface.

* * * * *

UNITED STATES PATENT AND TRADEMARK OFFICE
CERTIFICATE OF CORRECTION

| | |
|---|---|
| PATENT NO. | : 7,402,905 B2 |
| APPLICATION NO. | : 11/462767 |
| DATED | : July 22, 2008 |
| INVENTOR(S) | : Mark H. Eskridge and Ijaz H. Jafri |

Page 1 of 1

It is certified that error appears in the above-identified patent and that said Letters Patent is hereby corrected as shown below:

Column 3, Line 50, "in" should be --pin--.

Signed and Sealed this

Thirtieth Day of September, 2008

JON W. DUDAS
*Director of the United States Patent and Trademark Office*